United States Patent
Funato et al.

(10) Patent No.: US 11,418,115 B2
(45) Date of Patent: Aug. 16, 2022

(54) CONTROLLER FOR ON-VEHICLE INVERTER

(71) Applicant: KABUSHIKI KAISHA TOYOTA JIDOSHOKKI, Kariya (JP)

(72) Inventors: Motonobu Funato, Kariya (JP); Keiji Yashiro, Kariya (JP); Kazuhiro Shiraishi, Kariya (JP)

(73) Assignee: KABUSHIKI KAISHA TOYOTA JIDOSHOKKI, Kariya (JP)

( * ) Notice: Subject to any disclaimer, the term of this patent is extended or adjusted under 35 U.S.C. 154(b) by 24 days.

(21) Appl. No.: 17/162,576

(22) Filed: Jan. 29, 2021

(65) Prior Publication Data

US 2021/0249959 A1    Aug. 12, 2021

(30) Foreign Application Priority Data

Feb. 12, 2020    (JP) .............................. JP2020-021611

(51) Int. Cl.
*H02M 3/158* (2006.01)
*H03K 19/017* (2006.01)
*H03K 17/06* (2006.01)
*H02M 1/08* (2006.01)
*H02M 7/00* (2006.01)

(52) U.S. Cl.
CPC ............ *H02M 3/158* (2013.01); *H02M 1/08* (2013.01); *H03K 17/063* (2013.01); *H03K 19/01714* (2013.01); *H02M 7/003* (2013.01); *H03K 2217/0081* (2013.01)

(58) Field of Classification Search
CPC ...... H02M 1/0006; H02M 1/08; H02M 1/084; H02M 1/32; H02M 3/158; H02M 7/003; H02M 7/5387; H03K 17/063; H03K 19/01714; H03K 2217/0081; H02P 27/06; G01R 31/69
See application file for complete search history.

(56) References Cited

U.S. PATENT DOCUMENTS

| | | | |
|---|---|---|---|
| 9,272,704 B2 * | 3/2016 | Sato ....................... | B60W 10/08 |
| 2014/0009091 A1 | 1/2014 | Kamiya et al. | |
| 2018/0034384 A1 * | 2/2018 | Imura ................ | H03K 17/0822 |
| 2018/0167063 A1 * | 6/2018 | Akahane ............... | H02M 1/088 |

FOREIGN PATENT DOCUMENTS

| | | | | |
|---|---|---|---|---|
| JP | 2012-205445 A | 10/2012 | | |
| WO | WO-2014087609 A1 * | 6/2014 | ............ | H02M 3/158 |
| WO | WO-2017170819 A1 * | 10/2017 | ......... | B60H 1/00428 |

* cited by examiner

*Primary Examiner* — Matthew V Nguyen
(74) *Attorney, Agent, or Firm* — Sughrue Mion, PLLC

(57) ABSTRACT

A controller for an on-vehicle inverter includes an arm circuit and a driver. The driver includes a high-side drive circuit, a low-side drive circuit, and a bootstrap capacitor. The on-vehicle inverter includes a smoothing capacitor. The smoothing capacitor is supplied with leak current by an internal power supply via the bootstrap capacitor and a high-side semiconductor device. The controller further includes a voltage detector and an insertion-removal determination unit. The insertion-removal determination unit is configured to determine whether a connector has been inserted or removed from a change in voltage at ends of a smoothing capacitor detected by a voltage detector.

2 Claims, 7 Drawing Sheets

$$V_o = \frac{3 \cdot C1}{3 \cdot C1 + C2} \cdot Vin$$

$$V_o = \frac{3 \cdot C1}{3 \cdot C1 + C2 + C3} \cdot Vin$$

CONTROLLER FOR ON-VEHICLE INVERTER

BACKGROUND

1. Field

The present disclosure relates to a controller for an on-vehicle inverter.

2. Description of Related Art

In a motor-driven compressor connected to a high-voltage power supply via a connector, a known technique is used to determine whether the connector has been inserted or removed. Japanese Laid-Open Patent Publication No. 2012-205445 describes an example in which a current detection means and a load resistor are used. When the current detected by the current detection means flows from a power element toward the power supply, it is detected that the power supply has been disconnected from a power supply connection means.

In a typical technique, a current detection means and a load resistor are needed to determine whether a high-voltage connector has been inserted or removed.

SUMMARY

It is an objective of the present disclosure to provide a controller for an on-vehicle inverter capable of determining, with a simplified configuration, whether a connector connected to a power supply has been inserted or removed.

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

To achieve the above-described objective, a controller for an on-vehicle inverter is provided. The on-vehicle inverter is configured to control a motor of a motor-driven compressor and connected to a power supply via a connector. The controller includes an internal power supply, an arm circuit including a high-side semiconductor device and a low-side semiconductor device, and a semiconductor device driver configured to drive the arm circuit. The driver includes a high-side drive circuit that drives the high-side semiconductor device, a low-side drive circuit that drives the low-side semiconductor device, and a bootstrap capacitor used to drive a gate of the high-side semiconductor device. The on-vehicle inverter includes a smoothing capacitor. The smoothing capacitor is supplied with leak current by the internal power supply via the bootstrap capacitor and the high-side semiconductor device. The controller further includes a voltage detector configured to detect voltage at ends of the smoothing capacitor and an insertion-removal determination unit configured to determine whether the connector has been inserted or removed from a change in the voltage at the ends of the smoothing capacitor detected by the voltage detector.

Other features and aspects will be apparent from the following detailed description, the drawings, and the claims.

BRIEF DESCRIPTION OF THE DRAWINGS

Throughout the drawings and the detailed description, the same reference numerals refer to the same elements. The drawings may not be to scale, and the relative size, proportions, and depiction of elements in the drawings may be exaggerated for clarity, illustration, and convenience.

DETAILED DESCRIPTION

This description provides a comprehensive understanding of the methods, apparatuses, and/or systems described. Modifications and equivalents of the methods, apparatuses, and/or systems described are apparent to one of ordinary skill in the art. Sequences of operations are exemplary, and may be changed as apparent to one of ordinary skill in the art, with the exception of operations necessarily occurring in a certain order. Descriptions of functions and constructions that are well known to one of ordinary skill in the art may be omitted.

Exemplary embodiments may have different forms, and are not limited to the examples described. However, the examples described are thorough and complete, and convey the full scope of the disclosure to one of ordinary skill in the art.

An embodiment of the present invention will now be described with reference to the drawings.

Figure 1:
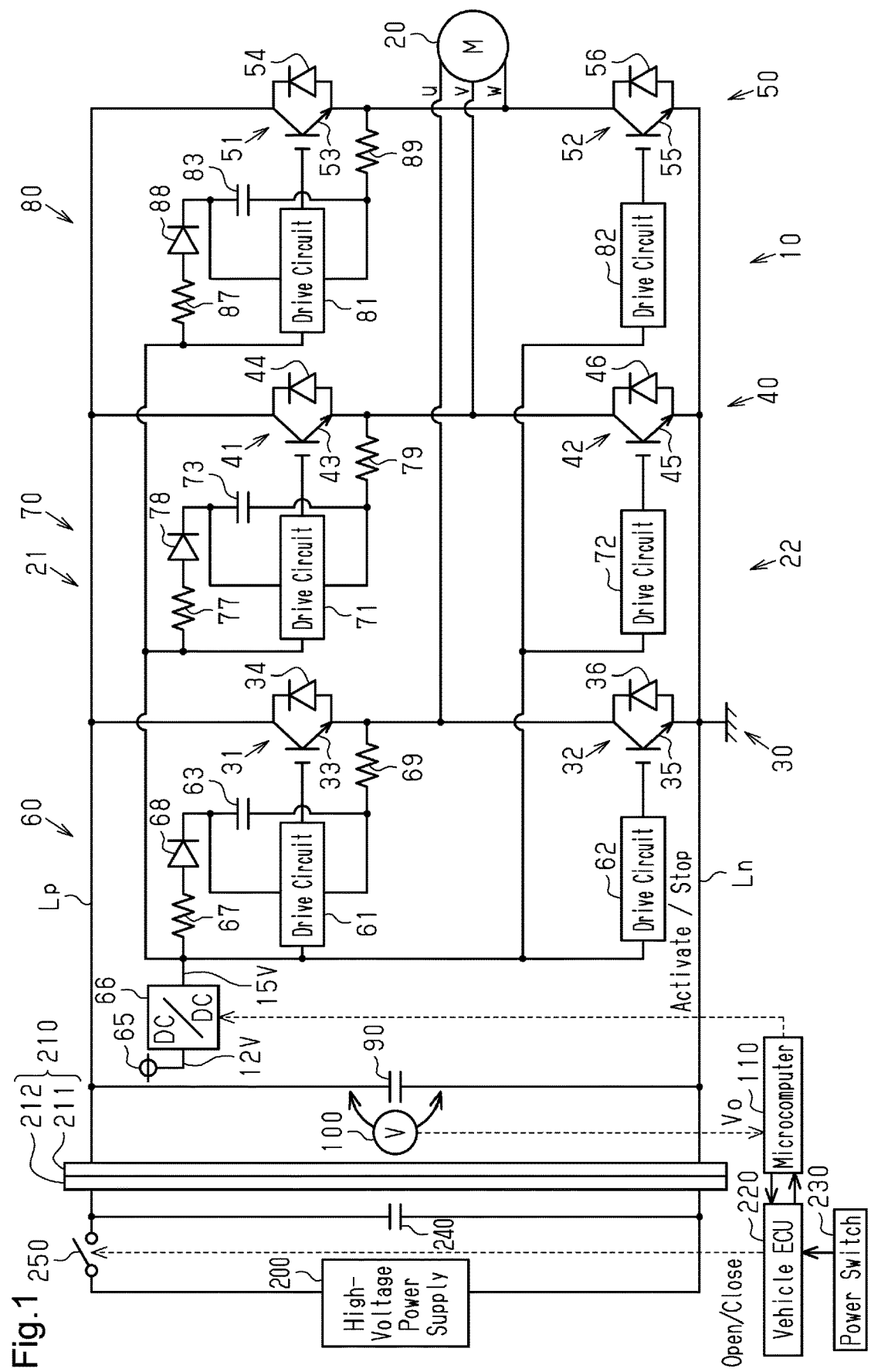
FIG. 1 is a circuit diagram showing the electrical configuration of a motor-driven compressor according to an embodiment.

As shown in FIG. 1, an on-vehicle motor-driven compressor 10 includes a motor 20. Driving the motor 20 drives a compression mechanism (not shown). The motor-driven compressor 10 is mounted on a vehicle such as an electric vehicle or a hybrid vehicle.

The motor-driven compressor 10 includes an on-vehicle inverter 21, which is configured to control the motor 20. The on-vehicle inverter 21 includes a positive electrode bus bar Lp and a negative electrode bus bar Ln.

The positive electrode bus bar Lp and the negative electrode bus bar Ln of the on-vehicle inverter 21 are connected to the positive electrode and the negative electrode of a high-voltage power supply 200 via a connector 210, respectively. The high-voltage power supply 200 is, for example, a 400V power supply. The high-voltage power supply 200 drives an electrical component such as a travel motor of the vehicle. The connector 210 includes connection portions 211, 212, one of which is a male connector and the other one of which is a female connector. When the connection portions 211, 212 are inserted and connected, power can be supplied from the high-voltage power supply 200 to the on-vehicle inverter 21. From this state, when the connected connection portions 211, 212 are removed and disconnected, the supply of power from the high-voltage power supply 200 to the on-vehicle inverter 21 is stopped.

The on-vehicle inverter 21 includes a controller 22. The controller 22 includes a u-phase arm circuit 30, a v-phase arm circuit 40, and a w-phase arm circuit 50. The u-phase arm circuit 30, the v-phase arm circuit 40, and the w-phase arm circuit 50 are connected in parallel between the positive electrode bus bar Lp and the negative electrode bus bar Ln.

The u-phase arm circuit 30 includes a high-side semiconductor device 31 and a low-side semiconductor device 32. The v-phase arm circuit 40 includes a high-side semiconductor device 41 and a low-side semiconductor device 42. The w-phase arm circuit 50 includes a high-side semiconductor device 51 and a low-side semiconductor device 52.

The high-side semiconductor device 31 includes an insulated gate bipolar transistor (IGBT) 33 and a diode 34, which is connected in antiparallel to the IGBT 33. The low-side semiconductor device 32 includes an IGBT 35 and a diode 36, which is connected in antiparallel to the IGBT 35. The high-side semiconductor device 31 and the low-side semiconductor device 32 are connected in series to each other, and a section of the series-connected circuit between the high-side semiconductor device 31 and the low-side semiconductor device 32 is connected to a u-phase terminal of the motor 20.

The high-side semiconductor device 41 includes an IGBT 43 and a diode 44, which is connected in antiparallel to the IGBT 43. The low-side semiconductor device 42 includes an IGBT 45 and a diode 46, which is connected in antiparallel to the IGBT 45. The high-side semiconductor device 41 and the low-side semiconductor device 42 are connected in series to each other, and a section of the series-connected circuit between the high-side semiconductor device 41 and the low-side semiconductor device 42 is connected to a v-phase terminal of the motor 20.

The high-side semiconductor device 51 includes an IGBT 53 and a diode 54, which is connected in antiparallel to the IGBT 53. The low-side semiconductor device 52 includes an IGBT 55 and a diode 56, which is connected in antiparallel to the IGBT 55. The high-side semiconductor device 51 and the low-side semiconductor device 52 are connected in series to each other, and a section of the series-connected circuit between the high-side semiconductor device 51 and the low-side semiconductor device 52 is connected to a w-phase terminal of the motor 20.

The u-phase arm circuit 30 is driven by a semiconductor device driver 60. The v-phase arm circuit 40 is driven by a semiconductor device driver 70. The w-phase arm circuit 50 is driven by a semiconductor device driver 80.

The u-phase driver 60 includes a high-side drive circuit 61, which drives the high-side semiconductor device 31, a low-side drive circuit 62, which drives the low-side semiconductor device 32, and a bootstrap capacitor 63, which is used to drive the gates of the high-side semiconductor device 31. The v-phase driver 70 includes a high-side drive circuit 71, which drives the high-side semiconductor device 41, a low-side drive circuit 72, which drives the low-side semiconductor device 42, and a bootstrap capacitor 73, which is used to drive the gates of the high-side semiconductor device 41. The w-phase driver 80 includes a high-side drive circuit 81, which drives the high-side semiconductor device 51, a low-side drive circuit 82, which drives the low-side semiconductor device 52, and a bootstrap capacitor 83, which is used to drive the gates of the high-side semiconductor device 51.

The controller 22 includes a DC/DC converter 66. The DC/DC converter 66 is connected to an internal power supply 65, which is a low-voltage power supply for the vehicle. The DC/DC converter 66 inputs 12V from the internal power supply 65, boosts 12V to 15V, and outputs 15V as the power supply voltage at the drive circuits 61, 62, 71, 72, 81, 82.

The output terminal of 15V of the DC/DC converter 66 is connected to one end (i.e., first end) of the bootstrap capacitor 63 via a resistor 67 and a diode 68. The other end (i.e., second end) of the bootstrap capacitor 63 is connected to the emitter of the IGBT 33 via a resistor 69. The output terminal of 15V of the DC/DC converter 66 is connected to the high-side drive circuit 61, and the high-side drive circuit 61 is connected to the gate of the IGBT 33. The high-side drive circuit 61 is supplied with 15V power supply from the DC/DC converter 66 and executes on-off control for the IGBT 33. Likewise, the output terminal of 15V of the DC/DC converter 66 is connected to the low-side drive circuit 62, and the low-side drive circuit 62 is connected to the gate of the IGBT 35. The low-side drive circuit 62 is supplied with 15V power supply from the DC/DC converter 66 and executes on-off control for the IGBT 35. The first end and the second end of the bootstrap capacitor 63 are connected to the high-side drive circuit 61.

The output terminal of 15V of the DC/DC converter 66 is connected to one end (i.e., first end) of the bootstrap capacitor 73 via a resistor 77 and a diode 78. The other end (i.e., second end) of the bootstrap capacitor 73 is connected to the emitter of the IGBT 43 via a resistor 79. The output terminal of 15V of the DC/DC converter 66 is connected to the high-side drive circuit 71, and the high-side drive circuit 71 is connected to the gate of the IGBT 43. The high-side drive circuit 71 is supplied with 15V power supply from the DC/DC converter 66 and executes on-off control for the IGBT 43. Likewise, the output terminal of 15V of the DC/DC converter 66 is connected to the low-side drive circuit 72, and the low-side drive circuit 72 is connected to the gate of the IGBT 45. The low-side drive circuit 72 is supplied with 15V power supply from the DC/DC converter 66 and executes on-off control for the IGBT 45. The first end and the second end of the bootstrap capacitor 73 are connected to the high-side drive circuit 71.

The output terminal of 15V of the DC/DC converter 66 is connected to one end (i.e., first end) of the bootstrap capacitor 83 via a resistor 87 and a diode 88. The other end (i.e., second end) of the bootstrap capacitor 83 is connected to the emitter of the IGBT 53 via a resistor 89. The output terminal of 15V of the DC/DC converter 66 is connected to the high-side drive circuit 81, and the high-side drive circuit 81 is connected to the gate of the IGBT 53. The high-side drive circuit 81 is supplied with 15V power supply from the DC/DC converter 66 and executes on-off control for the IGBT 53. Likewise, the output terminal of 15V of the DC/DC converter 66 is connected to the low-side drive circuit 82, and the low-side drive circuit 82 is connected to the gate of the IGBT 55. The low-side drive circuit 82 is supplied with 15V power supply from the DC/DC converter 66 and executes on-off control for the IGBT 55. The first end and the second end of the bootstrap capacitor 83 are connected to the high-side drive circuit 81.

The on-vehicle inverter 21 includes a smoothing capacitor 90. The smoothing capacitor 90 is connected to the positive electrode bus bar Lp and the negative electrode bus bar Ln, while being located between the arm circuits 30, 40, 50 and the connector 210 and between the positive electrode bus bar Lp and the negative electrode bus bar Ln.

The power line between the positive electrode of the high-voltage power supply 200 and the connector 210 is provided with a system main relay 250. A vehicle-side capacitor 240 is connected to the positive electrode and the negative electrode of the high-voltage power supply 200, while being located between the system main relay 250 and the connector 210 and between the positive electrode and the negative electrode of the high-voltage power supply 200.

The system main relay 250 is selectively opened and closed by a vehicle ECU 220. A power switch 230 for the vehicle is connected to the vehicle ECU 220. When the power switch 230 is turned on, the vehicle ECU 220 closes the system main relay 250. When the power switch 230 is turned off, the vehicle ECU 220 opens the system main relay 250.

The controller 22 for the on-vehicle inverter 21 includes a microcomputer 110. The microcomputer 110 commands the DC/DC converter 66 to be activated or stopped. The microcomputer 110 receives, from the vehicle ECU 220, a signal generated by turning on the power switch 230. When the signal is received, an activation command is sent from the microcomputer 110 to the DC/DC converter 66. The activation command from the microcomputer 110 causes the DC/DC converter 66 to input 12V, boost 12V to 15V, and output 15V. Further, a signal generated by turning off the power switch 230 is sent from the vehicle ECU 220 to the microcomputer 110. When the signal is received, a stop command is sent from the microcomputer 110 to the DC/DC converter 66. The stop command from the microcomputer 110 causes the DC/DC converter 66 to stop boosting the voltage.

The controller 22 includes a voltage sensor 100, which serves as a voltage detector configured to detect voltage Vo at the ends of the smoothing capacitor 90. The microcomputer 110 is connected to the voltage sensor 100. The microcomputer 110 is capable of detecting the voltage Vo at the ends of the smoothing capacitor 90 using a signal from the voltage sensor 100. The voltage sensor 100 detects an input voltage from the voltage Vo at the ends of the smoothing capacitor 90. The input voltage is used to execute vector control for the motor 20.

The operation of the present embodiment will now be described.

First, the operation of executing vector control for the motor 20 will be described with reference to FIGS. 2 and 3.

Figure 2:
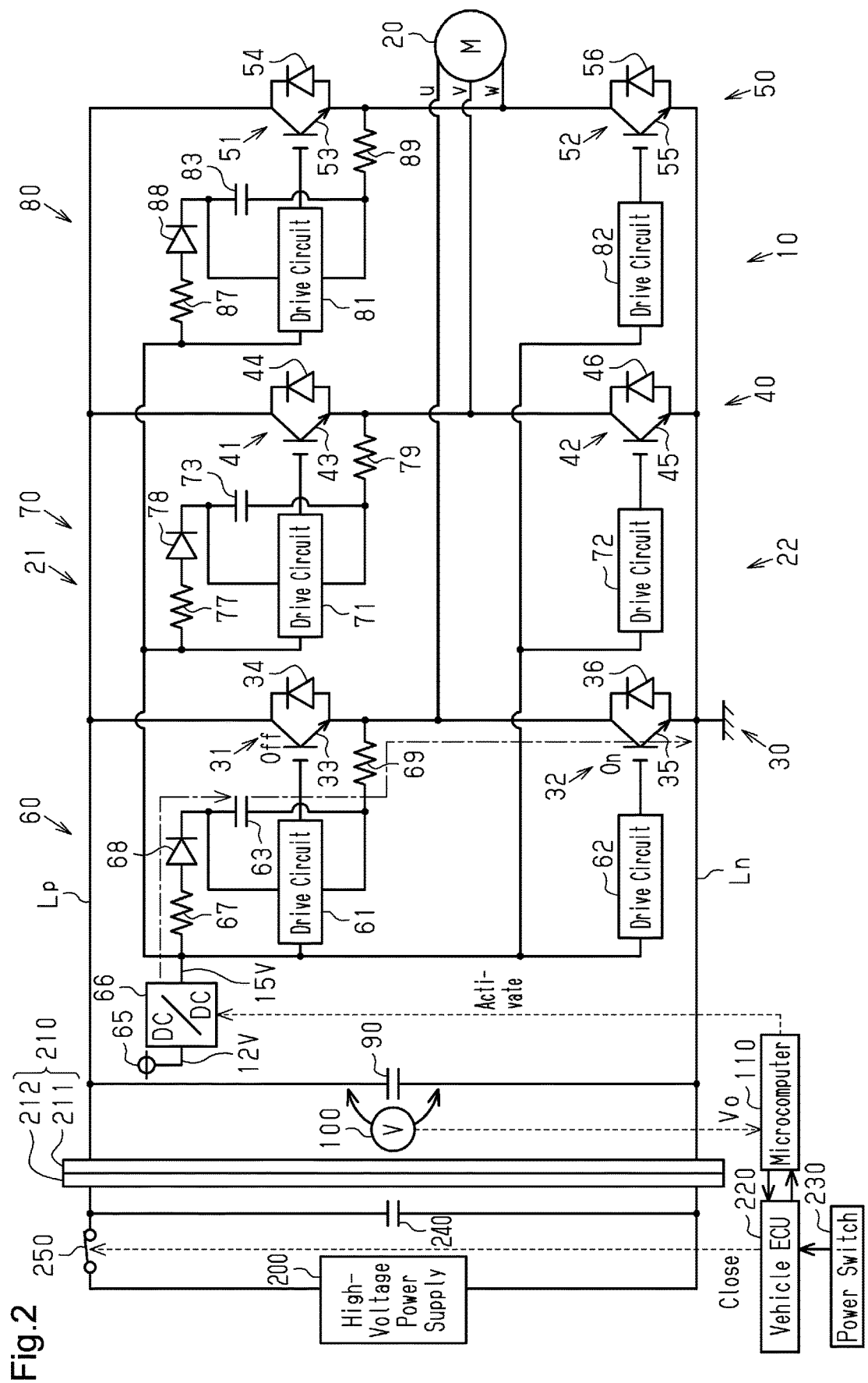
FIG. 2 is a circuit diagram showing the electrical configuration of the motor-driven compressor in FIG. 1.
Figure 3:
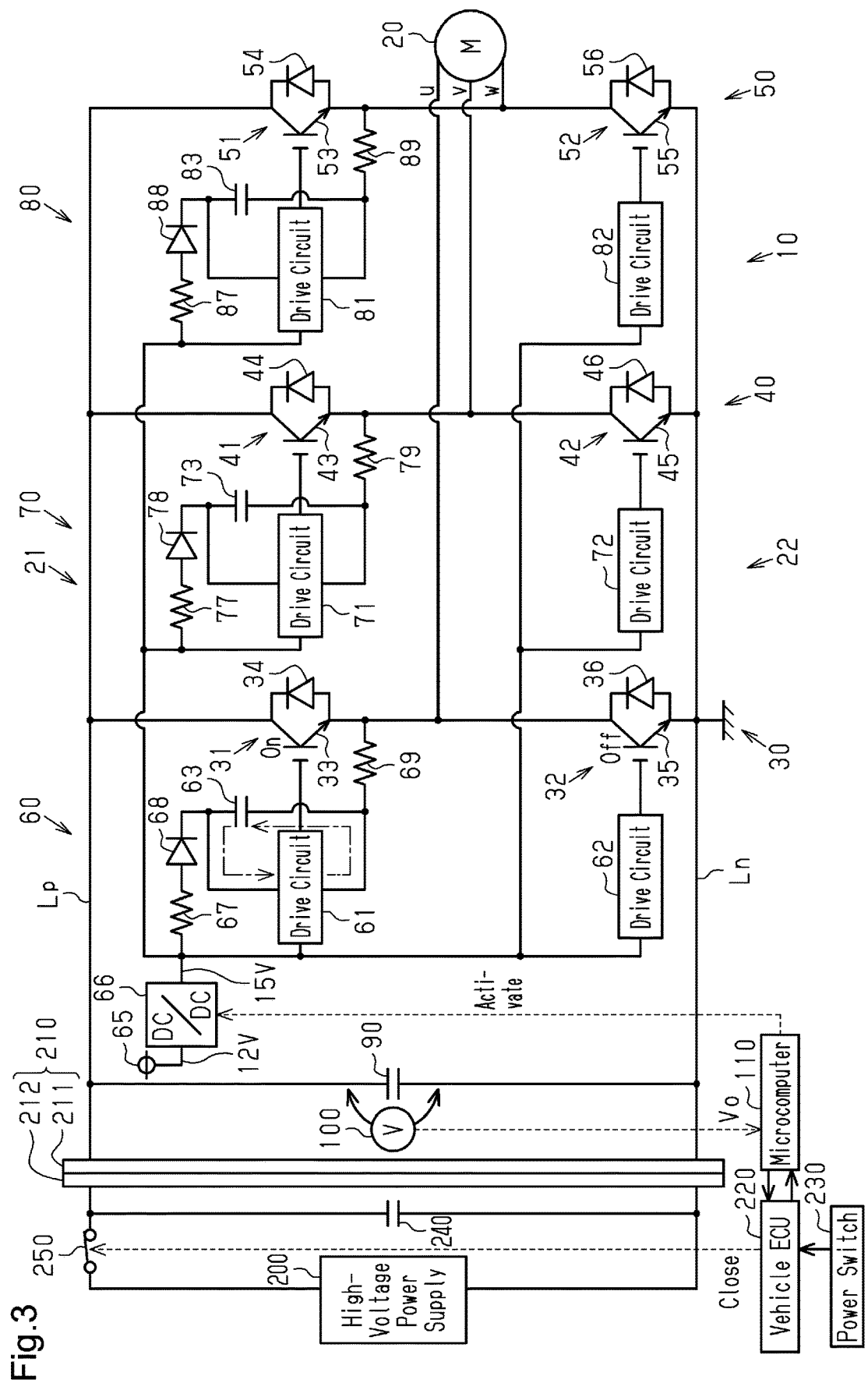
FIG. 3 is a circuit diagram showing the electrical configuration of the motor-driven compressor in FIG. 1.

As shown in FIG. 2, when the high-voltage power supply 200 is connected to the on-vehicle inverter 21 via the connector 210, turning on the power switch 230 causes the system main relay 250 to turn on (i.e., the circuit to close). When the high-side semiconductor device 31 and the low-side semiconductor device 32 of the u-phase arm circuit 30 are alternately turned on, turning on the low-side semiconductor device 32 causes current to flow in a path as indicated by the arrow in FIG. 2. This charges the bootstrap capacitor 63 in the high-side semiconductor device driver 60. Subsequently, as shown in FIG. 3, when the high-side semiconductor device 31 is turned on, the high-side semiconductor device 31 (IGBT 33) can be driven by the electric charge of the bootstrap capacitor 63, which is charged in the high-side semiconductor device driver 60.

The high-side semiconductor device 41 is operated in the same manner as the high-side semiconductor device 31. When the high-side semiconductor device 41 and the low-side semiconductor device 42 of the v-phase arm circuit 40 are alternately turned on, turning on the low-side semiconductor device 42 charges the bootstrap capacitor 73 in the high-side semiconductor device driver 70. Subsequently, when the high-side semiconductor device 41 is turned on, the high-side semiconductor device 41 (IGBT 43) can be driven by the electric charge of the bootstrap capacitor 73, which is charged in the high-side semiconductor device driver 70.

The high-side semiconductor device 51 is operated in the same manner as the high-side semiconductor devices 31, 41. When the high-side semiconductor device 51 and the low-side semiconductor device 52 of the w-phase arm circuit 50 are alternately turned on, turning on the low-side semiconductor device 52 charges the bootstrap capacitor 83 in the high-side semiconductor device driver 80. Subsequently, when the high-side semiconductor device 51 is turned on, the high-side semiconductor device 51 (IGBT 53) can be driven by the electric charge of the bootstrap capacitor 83, which is charged in the high-side semiconductor device driver 80.

Description will now be made for a determination process that determines whether the connector 210 has been inserted or removed at the point in time the power switch 230 was turned on, that is, whether the two connection portions 211, 212 of the connector 210 have been inserted or removed.

Figure 4:
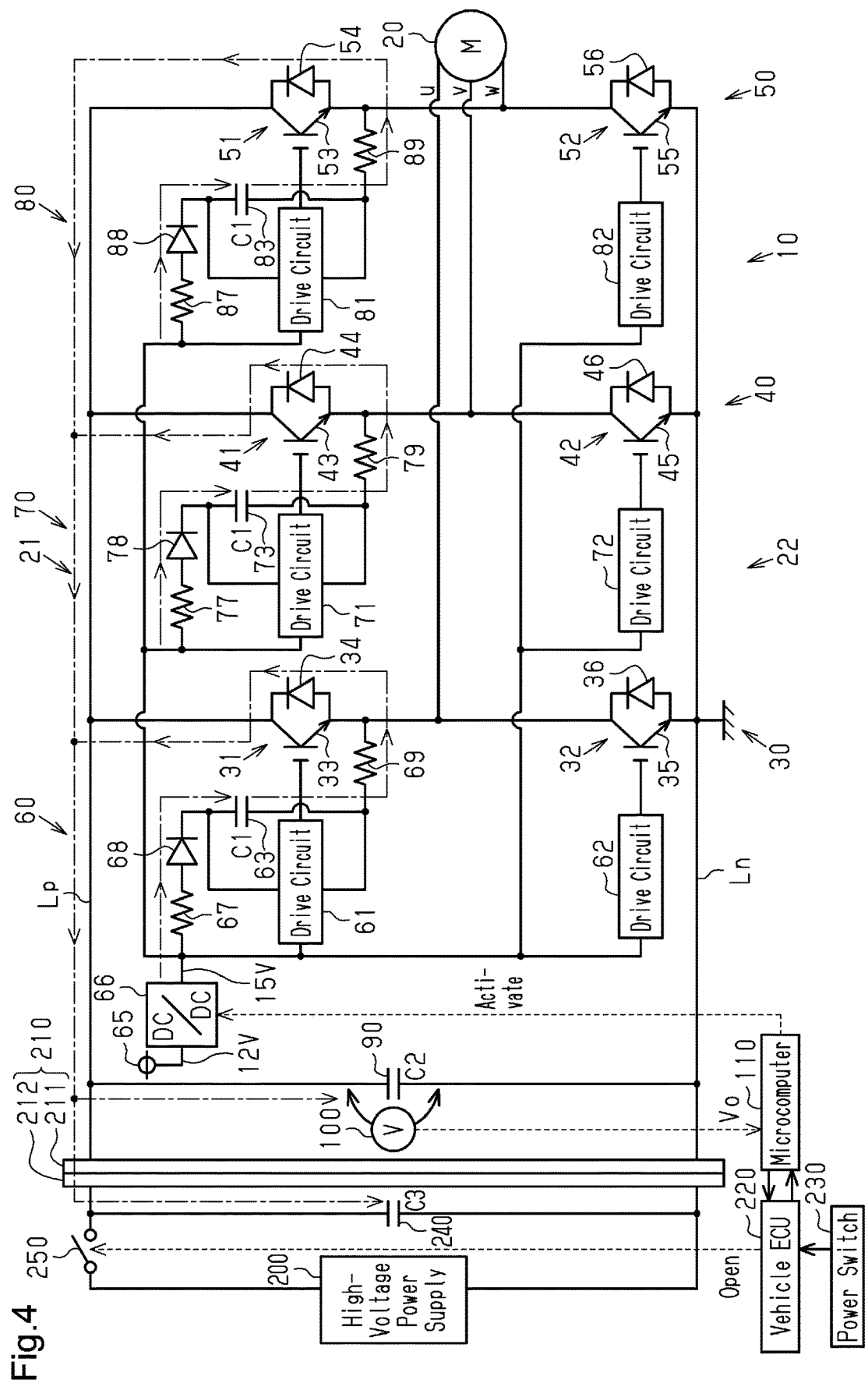
FIG. 4 is a circuit diagram showing the electrical configuration of the motor-driven compressor in FIG. 1.

As shown in FIG. 4, when the high-voltage power supply 200 is connected to the on-vehicle inverter 21 via the connector 210, the power switch 230 is off (i.e., the circuit is open). When the power switch 230 turns on, the microcomputer 110 activates the DC/DC converter 66, boosts 12V to 15V, and delivers 15V.

Thus, current flows in a path indicated by the arrow in FIG. 4 from the internal power supply 65 via the DC/DC converter 66. The smoothing capacitor 90 is supplied with leakage current via the bootstrap capacitors 63, 73, 83 and the high-side semiconductor devices 31, 41, 51. Further, the vehicle-side capacitor 240 is supplied with leakage current via the connector 210.

The microcomputer 110 determines whether the connector 210 has been inserted or removed, that is, whether the connector 210 is connected, from a change in the voltage Vo at the ends of the smoothing capacitor 90 detected by the voltage sensor 100.

More specifically, the microcomputer 110 determines whether the connector 210 has been inserted or removed depending on whether the voltage Vo at the ends of the smoothing capacitor 90 detected by the voltage sensor 100 is greater than or equal to a threshold value when a certain period of time T1 (refer to FIG. 7, described later) has elapsed after leakage current started to be supplied from the internal power supply 65 through the DC/DC converter 66 to the smoothing capacitor 90. That is, the microcomputer 110 determines whether the connector 210 has been inserted or removed depending on whether the voltage Vo at the ends of the smoothing capacitor 90 is greater than or equal to the threshold value when the certain period of time T1 has elapsed after leakage current started to be supplied from the internal power supply 65 through the DC/DC converter 66 to the smoothing capacitor 90.

Figure 5:
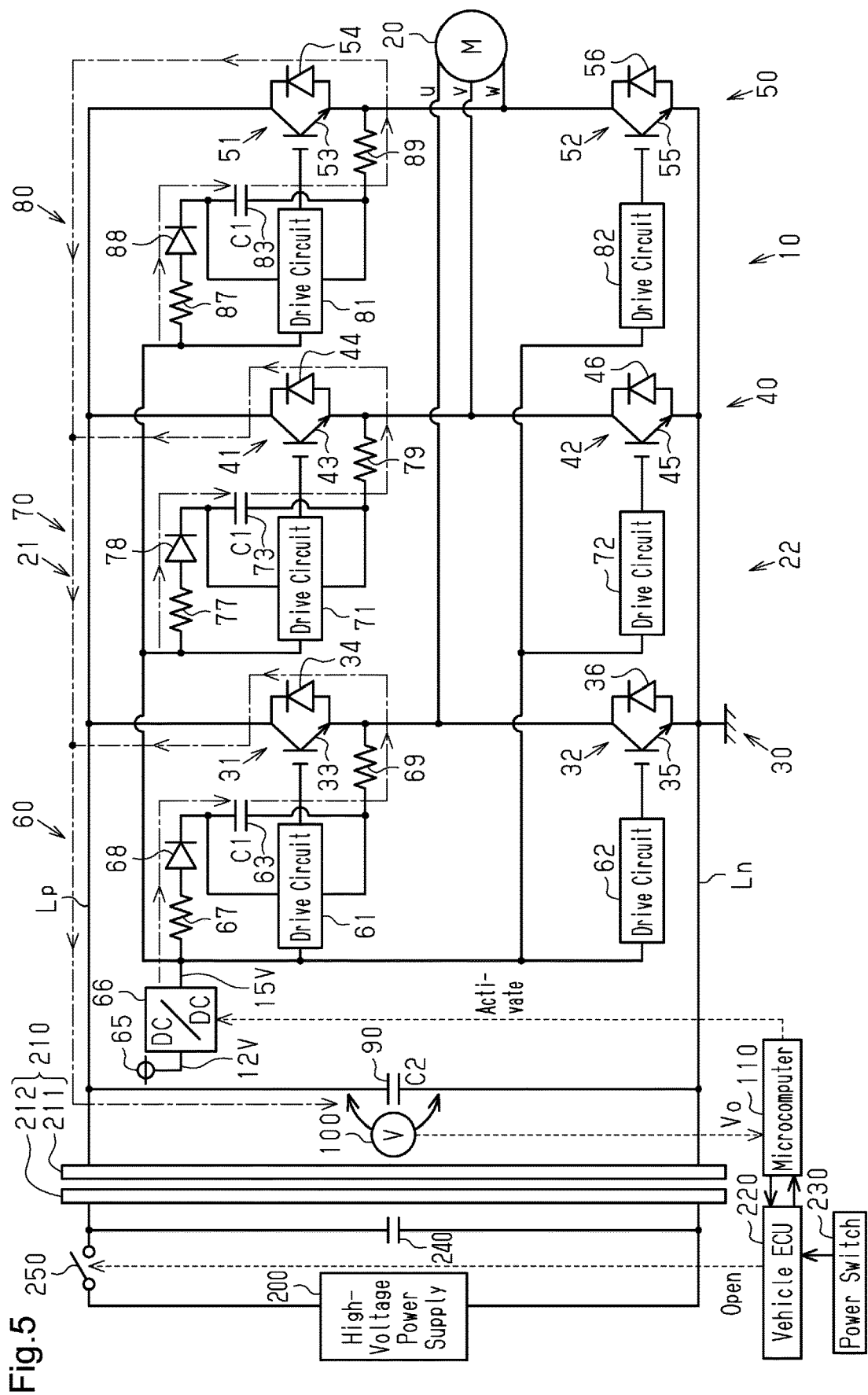
FIG. 5 is a circuit diagram showing the electrical configuration of the motor-driven compressor in FIG. 1.

When the connector 210 is open as shown in FIG. 5, turning on the power switch 230 causes the microcomputer 110 to activate the DC/DC converter 66, boost 12V to 15V, and deliver 15V. This causes only the smoothing capacitor 90 to be supplied with leakage current via the bootstrap capacitors 63, 73, 83 and the high-side semiconductor devices 31, 41, 51 as shown by the arrow in FIG. 5. The microcomputer 110 determines whether the connector 210 has been inserted or removed depending on whether the voltage Vo at the ends of the smoothing capacitor 90 detected by the voltage sensor 100 is greater than or equal to the threshold value.

Figure 6:
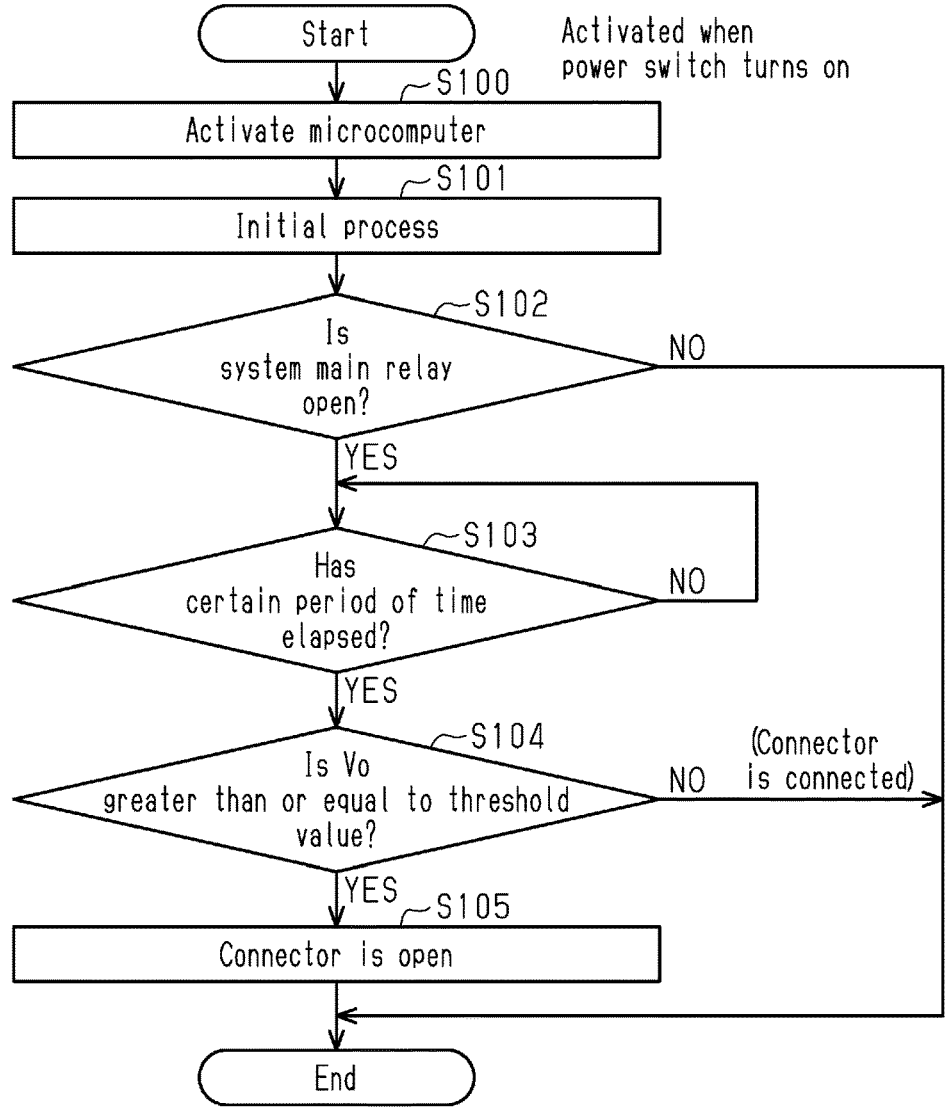
FIG. 6 is a flowchart illustrating the operation of the present embodiment.

The microcomputer 110 executes the processes shown in FIG. 6. The processes of FIG. 6 are started by turning the power switch 230 on.

The microcomputer 110 is activated in step S100 and executes an initialization process in step S101. In step S102, the microcomputer 110 communicates with the vehicle ECU 220 to determine whether the system main relay 250 is open. After confirming that the system main relay 250 is open, the microcomputer 110 determines in step S103 whether the certain period of time T1 (refer to FIG. 7) has elapsed. When determining that the certain period of time T1 has elapsed, the microcomputer 110 determines in step S104 whether the voltage Vo at the ends of the smoothing capacitor 90 detected by the voltage sensor 100 is greater than or equal to the threshold value. When the voltage Vo at the ends of the smoothing capacitor 90 is greater than or equal to the threshold value, the microcomputer 110 determines in step S105 that the connector 210 is open and notifies the vehicle ECU 220 that the connector 210 is open. The vehicle ECU 220 issues a warning indicating that the connector 210 is open. For example, the vehicle ECU 220 switches on a warning light to notify a user (for example, occupant such as driver) that the connector 210 is open In step S104, when the voltage Vo at the ends of the smoothing capacitor 90 detected by the voltage sensor 100 is less than the threshold value, it is determined that the connector 210 has not been removed and no anomaly has occurred. Then, a normal inverter control (vector control) is executed.

Figure 7:
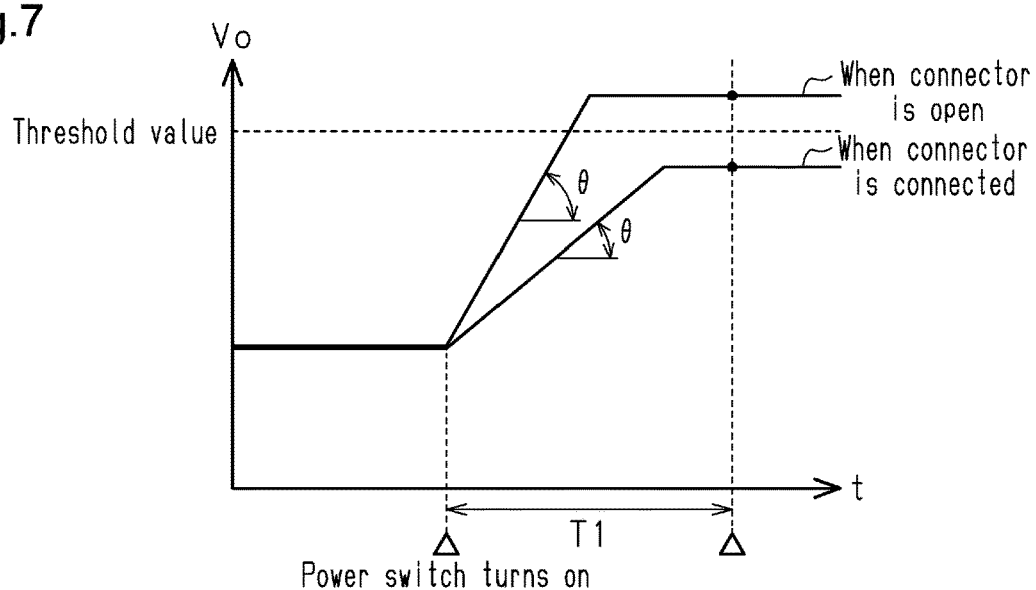
FIG. 7 is a timing diagram showing changes in the voltage at the ends of the smoothing capacitor.

In FIG. 7, the horizontal axis represents time, and the vertical axis represents the voltage Vo at the ends of the smoothing capacitor 90. By detecting the voltage Vo at the ends of the smoothing capacitor 90 when the certain period of time T1 (for example, 1 second) has elapsed after the power switch 230 was turned on, it is possible to identify whether the connector 210 is connected or open.

Figure 8:
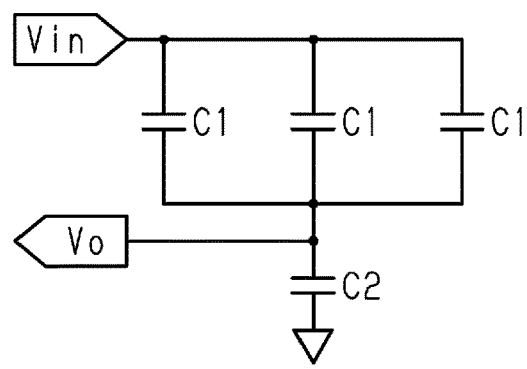
FIG. 8 is a diagram illustrating the determination whether the connector has been inserted or removed.

FIG. 8 shows the relationship between a capacitance C1 (refer to FIG. 5) of the bootstrap capacitors 63, 73, 83 and a capacitance C2 (refer to FIG. 5) of the smoothing capacitor 90 when the connector 210 is open. The bootstrap capacitors 63, 73, 83 connected in parallel are connected in series to the smoothing capacitor 90.

Thus, the voltage Vo at the ends of the smoothing capacitor 90 is expressed by the following equation, where the input voltage of the DC/DC converter 66 is Vin.

$$Vo = \{3 \cdot C1/(3 \cdot C1 + C2)\} \cdot Vin$$

Figure 9:
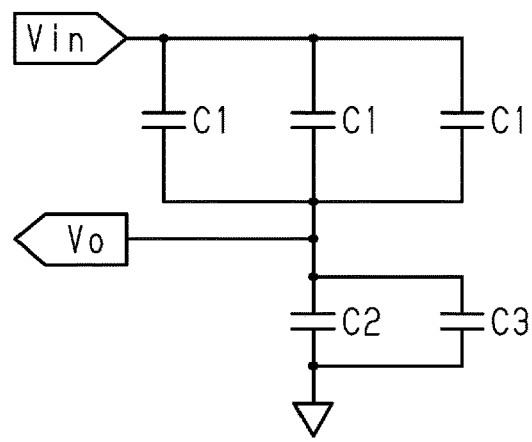
FIG. 9 is a diagram illustrating the determination whether the connector has been inserted or removed.

FIG. 9 shows the relationship between the capacitance C1 (refer to FIG. 4) of the bootstrap capacitors 63, 73, 83, the capacitance C2 (refer to FIG. 4) of the smoothing capacitor 90, and a capacitance C3 (refer to FIG. 4) of the vehicle-side capacitor 240 when the connector 210 is connected. The bootstrap capacitors 63, 73, 83 connected in parallel are connected in series to the smoothing capacitor 90. The smoothing capacitor 90 and the vehicle-side capacitor 240 are connected in parallel.

Thus, the voltage Vo at the ends of the smoothing capacitor 90 is expressed by the following equation, where the input voltage of the DC/DC converter 66 is Vin.

$$Vo = \{3 \cdot C1/(3 \cdot C1 + C2 + C3)\} \cdot Vin$$

This allows for the confirmation of whether the high-voltage connector 210 has been detached or attached, without using an additional circuit to confirm whether the high-voltage connector 210 has been detached or attached or using a current sensor.

In other words, the voltage Vo at the ends of the smoothing capacitor 90 between the ground and the input voltage Vin in FIGS. 8 and 9 is monitored. The voltage Vo at the ends of the smoothing capacitor 90 changes depending on the connected capacitance. Such a change eliminates the need for a dedicated sensor that determines whether the connector 210 has been inserted or removed.

More specifically, as shown in FIGS. 4 and 5, the smoothing capacitor 90 for filtering can be charged from the output terminal (15V) of the DC/DC converter 66 via the bootstrap capacitors 63, 73, 83 and the diodes 34, 44, 54 of the high-side semiconductor devices 31, 41, 51. When the connector 210 is open, the smoothing capacitor 90 is charged by leakage current flowing via the DC/DC converter 66 of the internal power supply 65. The behavior at this time is different from the one when the connector 210 is connected. Such a difference allows for the determination whether the connector 210 has been inserted or removed.

The above-described embodiment has the following advantages.

(1) In the configuration of the controller 22 for the on-vehicle inverter 21, the on-vehicle inverter 21, which controls the motor 20 of the motor-driven compressor 10, is connected to the high-voltage power supply 200, which serves as a power supply, via the connector 210. The controller 22 includes the semiconductor device drivers 60, 70, 80, which are used to drive the arm circuits 30, 40, 50 including the high-side semiconductor devices 31, 41, 51 and the low-side semiconductor devices 32, 42, 52. The drivers 60, 70, 80 include the high-side drive circuits 61, 71, 81, which drive the high-side semiconductor devices 31, 41, 51, the low-side drive circuits 62, 72, 82, which drive the low-side semiconductor devices 32, 42, 52, and the bootstrap capacitors 63, 73, 83, which are used to drive the gates of the high-side semiconductor devices 31, 41, 51. The on-vehicle inverter 21 includes the smoothing capacitor 90. The smoothing capacitor 90 is supplied with leakage current by the internal power supply 65, which is incorporated in the controller 22, via the bootstrap capacitors 63, 73, 83 and the high-side semiconductor devices 31, 41, 51. The controller 22 includes the voltage sensor 100, which is configured to detect the voltage Vo at the ends of the smoothing capacitor 90, and the microcomputer 110, which serves as an insertion-removal determination unit configured to determine whether the connector 210 has been inserted or removed from a change in the voltage Vo at the ends of the smoothing capacitor 90 detected by the voltage sensor 100. This eliminates the need for a current detection means or a load resistor and thus allows for the determination, with a simplified configuration, whether the connector 210 connected to the high-voltage power supply 200 has been inserted or removed.

(2) The microcomputer 110 (insertion-removal determination unit) determines whether the connector 210 has been inserted or removed depending on whether the voltage Vo at the ends of the smoothing capacitor 90 detected by the voltage sensor 100 is greater than or equal to the threshold value when the certain period of time T1 has elapsed after leakage current started to be supplied from the internal power supply 65 through the DC/DC converter 66 to the smoothing capacitor 90. This facilitates the determination whether the connector 210 has been inserted or removed.

The present disclosure is not limited to the above-described embodiment, but may be modified as follows.

In the above-described embodiment, the microcomputer 110 determines whether the connector 210 has been inserted or removed depending on whether the voltage Vo at the ends of the smoothing capacitor 90 is greater than or equal to the threshold value when a certain period of time has elapsed after leakage current started to be supplied from the internal power supply 65 to the smoothing capacitor 90 as shown in FIG. 7. Instead, the microcomputer 110 may determine whether the connector 210 has been inserted or removed depending on whether an inclination θ is greater than or equal to a threshold value when the voltage Vo at the ends of the smoothing capacitor 90 increases due to the leakage current supplied from the internal power supply 65 through the DC/DC converter 66 to the smoothing capacitor 90, which is shown in FIG. 7. That is, if the inclination θ when the increased voltage Vo at the ends of the smoothing capacitor 90 increases is less than the threshold value, the microcomputer 110 determines that no anomaly has occurred. Further, if the inclination θ when the increased voltage Vo at the ends of the smoothing capacitor 90 increases is greater than the threshold value, the microcomputer 110 determines that the connector 210 has been removed.

Here is a comparison between the case the microcomputer 110 determines whether the connector 210 has been inserted or removed depending on whether the voltage Vo at the ends of the smoothing capacitor 90 is greater than or equal to the threshold value when the certain period of time has elapsed after leakage current started to be supplied from the internal power supply 65 to the smoothing capacitor 90 and the case where the microcomputer 110 determines whether the connector 210 has been inserted or removed depending on whether the inclination θ is greater than or equal to the threshold value when the voltage Vo at the ends of the smoothing capacitor 90 increases due to the leakage current supplied from the internal power supply 65 to the smoothing capacitor 90. In the case where the microcomputer 110 determines whether the connector 210 has been inserted or removed depending on whether the voltage Vo at the ends of the smoothing capacitor 90 is greater than or equal to the threshold value when the certain period of time has elapsed after leakage current started to be supplied from the internal power supply 65 to the smoothing capacitor 90, the processing load for the determination is reduced. This facilitates the determination. In the case where the microcomputer 110 determines whether the connector 210 has been inserted or removed depending on whether the inclination θ is greater than or equal to the threshold value when the voltage Vo at the ends of the smoothing capacitor 90 increases due to the leakage current supplied from the internal power supply 65 to the smoothing capacitor 90, the microcomputer 110 determines in a short period of time whether the connector 210 has been inserted or removed.

Each of the high-side semiconductor devices and each of the low-side semiconductor devices include an IGBT and a diode connected in antiparallel to the IGBT. Instead, each of the high-side semiconductor devices and each of the low-side semiconductor devices may include, for example, a MOS transistor and a parasitic diode. In this case, a bootstrap capacitor is connected to the source of the MOS transistor.

Various changes in form and details may be made to the examples above without departing from the spirit and scope of the claims and their equivalents. The examples are for the sake of description only, and not for purposes of limitation. Descriptions of features in each example are to be considered as being applicable to similar features or aspects in other examples. Suitable results may be achieved if sequences are performed in a different order, and/or if components in a described system, architecture, device, or circuit are combined differently, and/or replaced or supplemented by other components or their equivalents. The scope of the disclosure is not defined by the detailed description, but by the claims and their equivalents. All variations within the scope of the claims and their equivalents are included in the disclosure.

What is claimed is:

1. A controller for an on-vehicle inverter, the on-vehicle inverter being configured to control a motor of a motor-driven compressor and connected to a power supply via a connector, the controller comprising:
   an internal power supply;
   an arm circuit including a high-side semiconductor device and a low-side semiconductor device; and
   a semiconductor device driver configured to drive the arm circuit, wherein the driver includes
   a high-side drive circuit that drives the high-side semiconductor device,
   a low-side drive circuit that drives the low-side semiconductor device, and
   a bootstrap capacitor used to drive a gate of the high-side semiconductor device,
the on-vehicle inverter includes a smoothing capacitor,
the smoothing capacitor is supplied with leak current by the internal power supply via the bootstrap capacitor and the high-side semiconductor device, and
the controller further comprises:
   a voltage detector configured to detect voltage at ends of the smoothing capacitor; and
   an insertion-removal determination unit configured to determine whether the connector has been inserted or removed from a change in the voltage at the ends of the smoothing capacitor detected by the voltage detector.

2. The controller according to claim 1, wherein the insertion-removal determination unit is configured to determine whether the connector has been inserted or removed depending on whether the voltage at the ends of the smoothing capacitor detected by the voltage detector is greater than or equal to a threshold value when a certain period of time has elapsed after the leakage current started to be supplied from the internal power supply to the smoothing capacitor.

* * * * *